Figure 1:
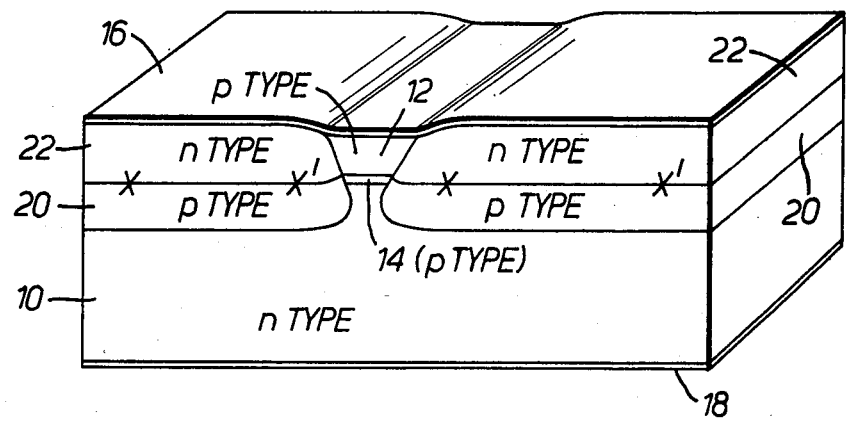

United States Patent [19]

Goodfellow et al.

[11] Patent Number: 4,542,511
[45] Date of Patent: Sep. 17, 1985

[54] SEMI-CONDUCTOR LASERS

[75] Inventors: Robert C. Goodfellow, Brackley; Malcolm E. Harding, Stony Stratford, both of England

[73] Assignee: Plessey Overseas Limited, Ilford, England

[21] Appl. No.: 469,094

[22] Filed: Feb. 23, 1983

[30] Foreign Application Priority Data

Feb. 24, 1982 [GB] United Kingdom ................ 8205445

[51] Int. Cl.$^4$ ............................................. H01S 3/19
[52] U.S. Cl. ........................................ 372/46; 357/17
[58] Field of Search ................ 372/44, 45, 46; 357/17

[56] References Cited

U.S. PATENT DOCUMENTS

| 4,366,569 | 12/1982 | Hirao et al. | 372/46 |
| 4,426,702 | 1/1984 | Yamashita et al. | 372/45 |

FOREIGN PATENT DOCUMENTS

| 0039886 | 11/1981 | European Pat. Off. | 372/46 |
| 3036431 | 4/1981 | Fed. Rep. of Germany | 372/46 |
| 56-4987 | 1/1981 | Japan . | |
| 56-157082 | 12/1981 | Japan | 372/46 |
| 1564908 | 4/1980 | United Kingdom | 372/46 |

OTHER PUBLICATIONS

"Buried Heterostructure 1.3 μm Lasers with Multiple Layer Infill," Goodfellow et al., IOOC 1981, 3rd International Conference on Integrated Optics and Optical Fiber Communication, San Francisco, Apr. 27-29, 1981, pp. 54-55.

"High Power Output InGaAsP/InP Buried Heterostructure Lasers," vol. 17, No. 21, pp. 782-783, published Oct. 15, 1981, Electronics Letters.

"Low-Threshold Current CW Operation of Multiple Infil Buried Heterostructure 1.3 μm GaInAsP Lasers," Plastow et al., Electronics Letters, vol. 18, No. 6, pp. 262-263, published Mar. 18, 1982.

Primary Examiner—James W. Davie
Attorney, Agent, or Firm—Fleit, Jacobson, Cohn & Price

[57] ABSTRACT

In a semi-conductor laser of buried active laser layer type, the laser layer is located between a layer of n-type material and a layer of p-type material, the sides of the active laser layer and at least a portion of the n-type layer and the p-type layer being covered with a plurality of thin layers with a doping sequence such that a large number of p-n junctions are included in the plurality of thin layers.

6 Claims, 5 Drawing Figures

SEMI-CONDUCTOR LASERS

This invention relates to semi-conductor lasers of the type comprising a plurality of epitaxial layers and a buried active laser layer in order to obtain light and carrier confinement in the active laser layer.

Such a semi-conductor laser is described in U.K. Pat. No. 1,564,908 but a problem with this type of laser is current leakage around the sides of the active laser stripe. As the width of the stripe is reduced the operating current reduces, but the current leakage remains unchanged. The leakage may thus dominate the current of narrow stripe lasers.

One method of inhibiting this leakage is to provide an infill at each side of the active stripe consisting of a p-type material followed by an n-type material which introduces a reversed biassed junction and so substantially prevents current flow. The junction should terminate in line with the active stripe but if the junction is out of line with the stripe, current will leak either from the p-type layer above the active stripe through the p-type infill, or there will be a direct current path from the n-type infill to the n-type body. The use of a single reversed biassed junction thus necessitates extreme accuracy of location of the junction and it is an object of the present invention therefore to provide means for preventing current leakage around the sides of the active laser stripe which does not require this degree of accuracy.

According to the present invention a semiconductor laser of the type referred to comprises an active laser layer located between a layer of n-type material and a layer of p-type material, the sides of the active laser layer and at least a portion of each of the n-type layer and the p-type layer being covered by a plurality of thin layers with a doping sequence such that a large number of p-n junctions are included in the plurality of thin layers.

Thus the plurality of thin layers may be doped n-type, intrisic, p-type, n-type, intrisic, p-type etc. sequentially.

Figure 2:
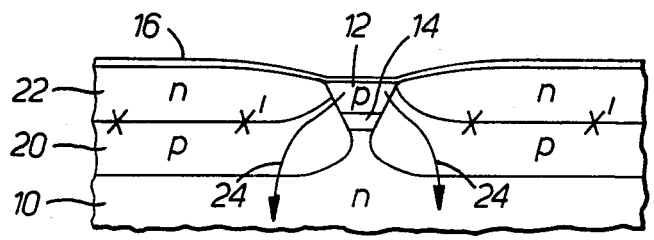
Figure 3:
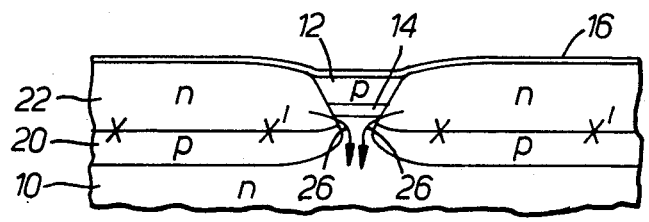
Figure 4:
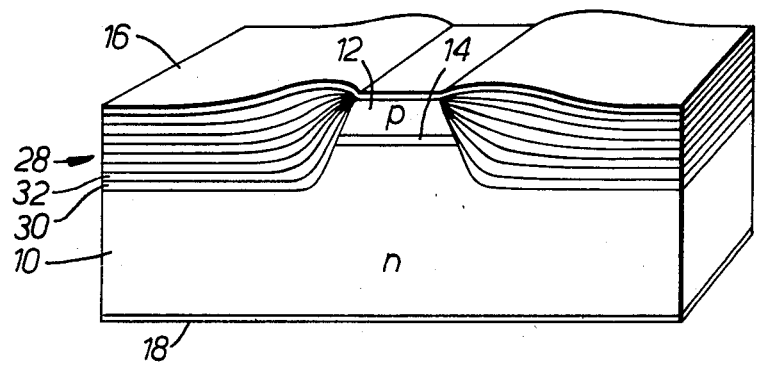
Figure 5:
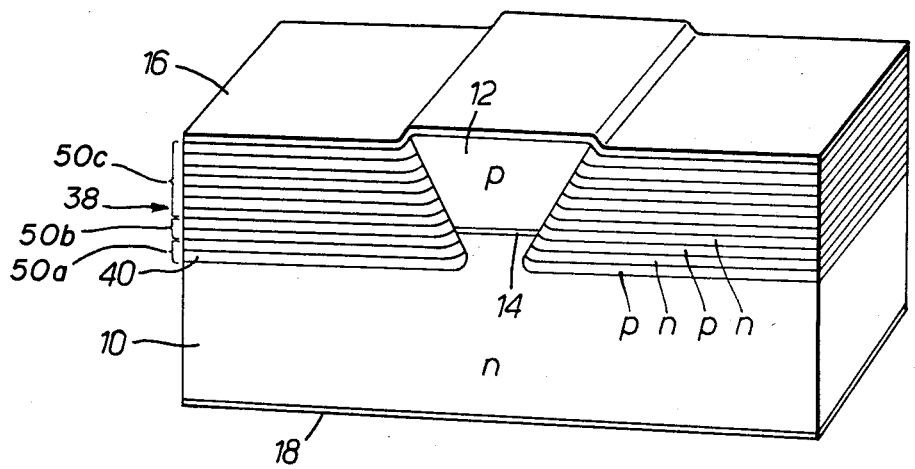

An embodiment of the invention will now be described by way of example only with reference to the accompanying drawings in which FIGS. 1 show in schematic form a known design of semiconductor laser, FIGS. 2 and 3 are scrap cross-sectional views of the semiconductor laser shown in FIG. 1, and FIG. 4 illustrates in schematic form one example of a semi-conductor laser constructed in accordance with the invention and FIG. 5 illustrates another example of a semi-conductor laser constructed in accordance with the invention.

In FIG. 1 is illustrated a known type of buried heterostructure laser comprising an indium phosphide substrate 10 of n-type conductivity and an indium phosphide layer 12 of p-type conductivity.

A gallium indium arsenide phosphide active laser stripe 14 of elongated shape and of p-type conductivity is located between the substrate 10 and the layer 12 and forms a reversed biassed p-n junction between it and the substrate 10. The free ends of the laser stripe 14 emerge at separate surfaces of the indium phosphide body. Abutting the sides of the laser stripe 14 is an infill comprising a layer 20 of p-type indium phosphide followed by a layer 22 of n-type indium phosphide which introduces a reversed biassed junction $XX^1$ and substantially prevents current leakage from the layer 12 around the sides of the laser stripe 14.

A metal contact 16 is formed on the layers 12 and 22 covering the whole surface of the structure and a further metal contact 18 is secured to the base of the structure.

The junction $XX^1$ should terminate on the side of the laser stripe 14 for minimum current leakage.

However if the line $XX^1$ terminates slightly above the active stripe 14 (which is normally very thin, of the order of 0.2 μm) as illustrated in FIG. 2, current can leak along the lines of the arrows 24. Alternatively if the line $XX^1$ terminates below the active stripe 14 as shown in FIG. 3 there will be a direct current (short circuit) path along the lines of the arrows 26. Thus with the single junction approach it is necessary to control the reverse bias junction position to extremely high accuracy.

FIG. 4 shows a semi-conductor laser in which the two infill layers 20 and 22 are replaced by a large number of very thin layers 28 with a doping sequence such that a large number of p-n junctions are laid down. The doping sequence is n, i (intrinsic), p,n,i,p . . . etc, A n-type layer 30 is deposited first and covers the substrate 10 and the sides of the laser stripe 14 and the p-type layer 12. The following layer 32 is formed so as to completely cover the layer 30 and subsequent layers all completely cover the preceding layer.

The advantages here are that all possible leakage paths involve conduction along very thin layers (approximately 0.05 μm) and hence are significantly more resistive than in the structures described and illustrated in FIGS. 1 to 3. Also most paths involve conduction through numbers of forward and reverse biassed p-n junctions in series. This results in a significant reduction in the current leakage at the sides of the active region.

In FIG. 5 there is shown a similar semi-conductor laser having a large number of very thin layers 38 with a doping sequence such that a large number of p-n junctions are laid down. The doping sequence is p and n alternately.

The first layer 40 is substantially flat and does not cover the sides of the laser stripe 14 and the p-type layer 12. Subsequent layers are similar resulting in the ends of the layers 38 abutting the sides of the raised part of the substrate 10, the laser stripe 14 and the p-type layer 12. In this case the active stripe 14 is located between a layer 10 and a layer 12 which together have a trapezoidal cross-sectional shape and the use of the large number of separate layers achieves good electrical isolation in the mesa'd structure where growth on the walls of the layer 12 and the raised portion of the substrate 10 is sufficiently slow to permit "stacking" of the layers 38. This is the case with re-entrant mesas in InP having (III) A faces. The layer 40 below active laser stripe 14 provides a reverse-biased p-n junction (or junctions if more layers are below the active laser stripe). Portions 50a, b and c of the layers have ends abutting the non-parallel trapezoidal side of n-layer 10, active laser stripe 14 and p-type layer 12, respectively.

The method may be extended to make the sequence of infill layers 38 include large band gap materials and therefore heterojunctions which will have a higher breakdown voltage and perhaps lower conductivity because of different transport properties.

The method of using a large number of very thin layers with a large number of p-n junctions may also be used where high resistance groups III–V semiconductor layers are required.

By including small bandgap layers into the multilayer infill 28, regions of high refractive index can be introduced at the sides of the active region. This will be equivalent to decreasing the refractive index step at the edge of the active stripe 14. This will allow single transverse mode operation in wider stripes and could therefore offer increased single mode power capability in such lasers.

We claim:

1. In a semi-conductor laser comprising a plurality of epitaxial layers and a buried active laser layer characterised in that said active laser layer is located between a layer of n-type material and a layer of p-type material, the n-type layer and the p-type layer together having a trapezoidal cross-sectional shape, the sides of said active laser layer and at least a portion of each of said n-type layer and said p-type layer being covered by a plurality of thin layers which are substantially planar whereby the ends of a first, second and third portion of said plurality of thin layers abut the sides of said n-type layer, said active laser layer and said p-type layer, respectively, said plurality of thin layers having a doping sequence such that a plurality of p-n junctions is formed by said plurality of thin layers and said first portion of said plurality of thin layers forming at least one p-n junction below said active laser layer.

2. A semi-conductor laser as claimed in claim 1 in which said plurality of thin layers is doped n-type, intrinsic, p-type, n-type, intrinsic, etc. sequentially.

3. A semi-conductor laser as claimed in claim 1 in which said plurality of thin layers is doped p-type, n-type alternatively.

4. A semi-conductor laser as claimed in claim 1 in which a metal contact is formed over said plurality of thin layers and said p-type layer and a further metal contact is formed over said n-type layer.

5. A semi-conductor laser as claimed in claim 1 in which the active laser layer comprises gallium indium arsenide phosphide, and said n-type and said p-type layers comprises indium phosphide.

6. A semi-conductor laser as claimed in claim 1 in which said plurality of thin layers comprises indium phosphide.

* * * * *